United States Patent [19]

Huebner

[11] 4,184,730

[45] Jan. 22, 1980

[54] ELECTRICAL BUILDING BLOCKS INCORPORATING AN ANGULAR ADAPTER AND A PROCESS TO MANUFACTURE THE SAME

[75] Inventor: Wolfgang Huebner, Munich, Fed. Rep. of Germany

[73] Assignee: Siemens Aktiengesellschaft, Berlin & Munich, Fed. Rep. of Germany

[21] Appl. No.: 905,228

[22] Filed: May 12, 1978

[30] Foreign Application Priority Data

May 23, 1977 [DE] Fed. Rep. of Germany ....... 2723201

[51] Int. Cl.$^2$ .............................................. H05K 1/10
[52] U.S. Cl. .................. 339/17 LC; 29/629; 361/404
[58] Field of Search ............. 339/17 R, 17 C, 17 LC, 339/276 R, 276 A; 361/403–408, 415, 421; 29/629

[56] References Cited

U.S. PATENT DOCUMENTS

| | | | |
|---|---|---|---|
| 3,523,273 | 8/1970 | Hammell et al. | 339/276 A X |
| 4,118,757 | 10/1978 | Rinaldo | 361/404 |

FOREIGN PATENT DOCUMENTS

| | | |
|---|---|---|
| 1944378 | 8/1966 | Fed. Rep. of Germany. |
| 1911779 | 9/1970 | Fed. Rep. of Germany ........... 361/406 |
| 2219315 | 6/1976 | Fed. Rep. of Germany. |
| 484592 | 5/1976 | U.S.S.R. .............................. 339/276 A |

Primary Examiner—E. F. Desmond

Attorney, Agent, or Firm—Hill, Van Santen, Steadman, Chiara & Simpson

[57] ABSTRACT

An electrical building block incorporates an angular adapter in which the contact pins which extend on a side of the building block, which is vertical to the plane of installation, are connected by way of conductor elements with a connector tab which is vertical to the plane of installation. The conductor elements are designed to form, in one piece, also the connector tabs by means of metal strips which are attached in one plane to the contact side of the building block and surround, by means of solder eyelets, the corresponding contact pins of the building block. In particular, by means of bending at least a part of the metal strips alongside of the building block surface, at least along the side of two vertical side walls with regard to the installation plane, in a row of holes in the carrier plate which carries the building block there are connector tabs provided which can be anchored. A number of contact strips are stamped out from a metal strip in accordance with the number of contact pins of the building block and at their relative positions also solder eyelets are cut in such a way as to remain connected by way of interim bridges. The connected conductor strips are pushed onto the contact side of the building block simultaneously and the connector pins of the building block are soldered to the eyelets. The interim bridges are separated and the connector tabs are anchored in the openings of the carrier plate.

11 Claims, 9 Drawing Figures

ELECTRICAL BUILDING BLOCKS INCORPORATING AN ANGULAR ADAPTER AND A PROCESS TO MANUFACTURE THE SAME

BACKGROUND OF THE INVENTION

1. Field of the Invention

The present invention relates to an electrical building block incorporating an angular adapter, whereby the connection terminals which exit at the sides of the component are vertical to the plane of mounting and are coupled, by way of conductor elements which are joined to connecting tabs vertical to the plane of mounting, and wherein the conductor elements and the respective connecting tabs are struck from the same piece of flat metal strips which are arranged in a single plane of the connector side of the building block and connect, by means of eyelets, the connector pins of the building block.

2. Description of the Prior Art

Electrical building blocks, for example relays, frequently have a housing in block form which has different side lengths depending on the construction, the normal mounting of such a building block on a printed circuit board resulting in either a large mounting area with a small height or a small mounting area and a large height.

In order to do justice to the different requirements with respect to block height and mounting area, relays have been constructed which have in the housing openings for the connector legs of contact springs in two side walls which are perpendicular to each other, as disclosed in German Pat. No. 2,210,315. Such a solution is not always possible, however, particularly in a building block which has a great number of contacts. Particularly already existing designs require a major effort for a change over.

Furthermore, there is also known, for horizontally mounted relays, a plug and solder mount in which the extended and rectangularly bent relay contact pins are arranged between pilot pins at the base of a header, as disclosed in the German Utility Model Pat. No. 1,944,378. Furthermore, also an angular plug mount has been recommended, whereby the conductor strips, by means of solder eyelets, surround the pins of the plugged-in building block and which form, by means of rectangularly bent out extensions, the connector tabs for the mounting plane.

These known angular adapters for this type of building block have the disadvantage that the building block itself is not tightly attached to its support, a printed circuit (PC) board, such that the connectors are mechanically stressed by bending forces. Therefore, frequently additional holding clamps for the building block are required. In addition, these known angular adapters increase the base area and especially the mounting height of the building block considerably.

SUMMARY OF THE INVENTION

It is the object of the present invention to equip an electrical building block with an angular adapter without changing the designs of the building block itself. Furthermore, the adapter should be manufactured with few individual parts, economically, and lend itself to be attached to the building block in a process which is suitable for automation. Finally, the adapter should be designed such that the building block to be mounted in an angular manner is similarly stably joined to the PC board by means of the connector tabs of the adapter; as if it was mounted in its normal mounting position.

According to the invention, the above object is achieved by employing a building block and an angular adapter of the aforementioned type which features bending out at least a part of the metal strips in the direction of the surface of the building block, at least along two side walls which are perpendicular to the mounting plane, and in which connecting tabs are provided which can be fastened to a row of holes in the PC board which carries the building block. The building block and its angular adapter is, according to the present invention, connectable with the connector tabs and stable solder connections to the PC board, due to the fact that the solder tabs are not only arranged along one side as an extension of the connector side of the building block, but also at least on one more side plane surrounding the building block. The mounting area increase is, in this fashion, relatively small, and is not only extended in one direction. The adapter can also be produced and mounted relatively inexpensively, due to the fact that metal strips can be continuously manufactured in automatic assembly steps by stamping, bending and cutting.

These metal strips follow closely the side planes of the building block and remain oriented, generally in one plane, such as to be easily accessible for service and to require little space. Individual sections of the strips, however, can be bent out of the common mounting plane, in order to create larger free space distances, for example, between adjacent strips and thereby increase the arcing resistance if high voltages are applied. It is also possible to have all strips in their common planes not directly attached to the side planes of the building block, but to space the strips at a predetermined distance from the respective connector side, so as to assure increased creep resistance.

In one of the preferred forms of execution of the invention, the connector tabs formed by the metal strips are arranged in three planes which surround the building block in a U-shape. In this case, the element to be mounted can be joined to the connector tabs of the adapter in a particularly stable configuration. The carrier plate for the building block serves, in special cases, as the printed circuit board into which the connector tabs of the adapter are plugged-in directly.

In the normal case, however, an individual carrier plate is used which consists of a base carrier made of insulated material which has connector blocks, and at least two sides of the building block extend over the mounting area of the building block and have holes acting as the receptors for the connector tabs. In order to assure a stable mounting of the connector tabs, these connector blocks, on the side of the building block, can have greater thickness than the area of the base carrier which is supporting the building block. Depending on the design of the connector tabs and the mounting thereof, the openings in the base carrier can be made in the form of complete holes, or in the form of slots, each of which has a side opening. The connector tabs are practically designed with support shoulders which rest on the printed circuit board, respectively, the base carrier. In order to prevent a side shift of the connector tabs, in the case of the use of open slots in the base carrier, recesses in the slot area can be provided to accept the shoulders of the connector tabs. At the side opposite to the building block the connector tabs are practically attached to the carrier plate by indenting or twisting.

In a further useful improvement, according to the present invention, the base carrier has additional hold down elements for the building block, constructed in the form of spring-like hooks which snap into the building block housing. This structure provides additional stability in the connection between the building block and the adapter.

In the manufacture and assembly of the adapter, it is useful to first cut out of the metal band a number of strips corresponding to the number of contact pins of the building block, which pins are equipped with eyelets corresponding to the location of the contact pins, but only to the degree that they are still connected by means of bridges in the area of the connector tabs. These connected contact strips can all be plugged into the connection plane of the building block and, by means of the solder eyelets, soldered to the contact pins of the building block. Finally, the bridges can be cut out and the connector tabs can be anchored in the holes of the carrier plate.

A multiple metal strip sheet formed by the bridge-connected metal strips can be bent in the form of a U, in accordance with the dimensions of the building block, before it is attached. After the soldering operations of the metal strip sheet, and the contact pins of the building block, all bridges are cut out. In order to simplify the separation of the bridges, the multiple strip sheet can also be attached and soldered to the contact side of the building block in its planar configuration. The mechanism for separating out the bridges can thus be operated in a single plane.

In the latter case, a part of the metal strips is bent over the side walls of the building block after separation of the bridges. It is further useful to notch the bridge section in such a way that the bridges can easily be broken off later by bending.

The building block can first be connected to the metal strips, and then attached together with the connector tabs to the carrier plate, whereby the connector tabs are pushed perpendicularly into the holes of the carrier plate. It is, however, also possible to first place the building block on a carrier base and then plug in the metal strips, this being done by pushing the metal strips into the slots of the base carrier by means of their side opening. The metal strips for the adapters of several building blocks can be continuously punched from metal sheet material, assembled with individual building blocks and soldered in a common solder assembly. Only then is it practical to separate the individual converted building blocks from each other.

BRIEF DESCRIPTION OF THE DRAWINGS

Other objects, features and advantages of the invention, its organization, construction will be best understood from the following detailed description, taken in conjunction with the accompanying drawings, on which.

DESCRIPTION OF THE PREFERRED EMBODIMENTS

Figures 1, 2:
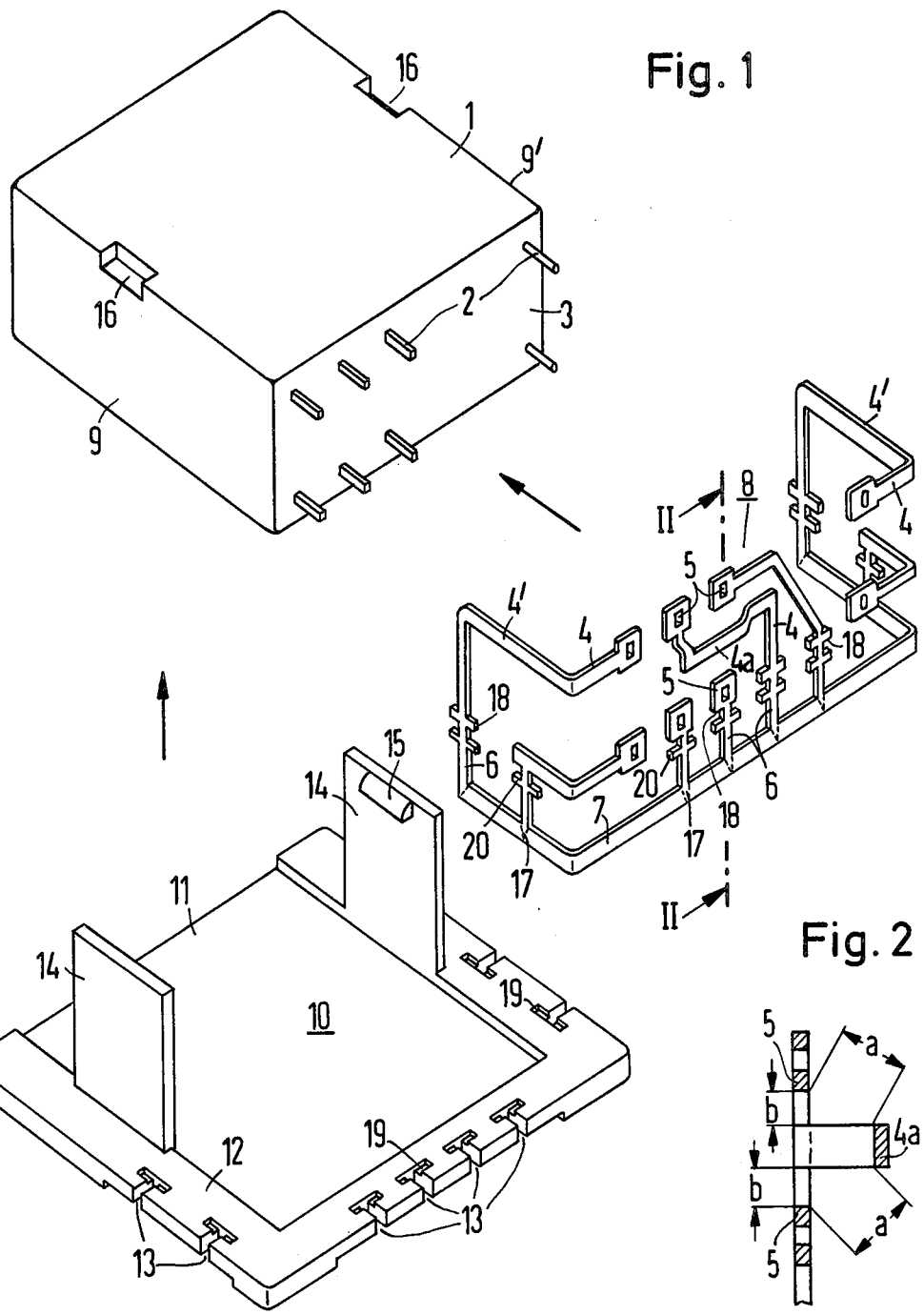
FIG. 1 is a an exploded view of an electronic building block and its adapter, constructed in accordance with the present invention.
FIG. 2 is a cross sectional view taken substantially along the parting line II—II of FIG. 1.

Referring to FIG. 1, an electromagnetic relay is illustrated in a block-like housing 1 which would normally be assembled standing on edge and therefore has its connector pins 2 on a contact side 3 which has a small side area. If the relay is mounted with the long dimension shown parallel to the mounting plane, the contact plane 3 will form a side wall area such that the contact pins must be connected to the base plane by an angular adapter.

The angular adapter for accomplishing the above-mentioned mounting comprises a pair of metal strips 4 which are attached to the contact side 3 of the relay 1 in a single plane. Each of the contact pins 2 has a corresponding strip 4 attached by means of a solder eyelet 5. Each metal strip forms a connector tab 6 which extends toward the mounting plane. The connector tabs 6 are, during assembly, connected with each other by means of a plurality of bridges 7. All of the connector strips 6 together form a multiple metal strip sheet 8 which is bent in a U-shape and which is pushed, as a frame, onto the connector side 3 of the relay 1 so that the pins 2 extend through the openings in the solder eyelets 5. The two sides of the frame 8 are formed by the corresponding angled frame strips 4 and the respective contact tabs 6. These sides of the U-shaped frame are attached to the sides 9, 9' which are adjacent the side 3 of the relay 1. In the exemplary embodiment illustrated in FIG. 1, one of the strips 4 with its contact strip 4a is bent out of the common support plane. FIG. 2 illustrates the distance by which the solder eyelet of this strip is displaced from the plane of the remainder of the solder eyelets. The distance a between the strips 4a and the solder eyelet 5 is clearly larger than the distance b, which is the vertical distance between a solder eyelet 5 and the strip 4a.

As soon as the solder eyelets 5 are soldered to the contact pins 2, the bridges 7 can be cut out such that the individual strips 4 and their contact tabs 6 can be anchored to the carrier plate, respectively. An adapter base 10 serves for the carrier plate and has a relatively thin center plate 11 as the support area for the relay 1, and on three sides has a connector block 12 for receiving the connector tabs 6 of the adapter. The connector block 12 is provided with a plurality of slots 13 which have correspondingly shaped openings for receiving the connector tabs.

As an additional means of attachment of the relay 1, the adapter base plate plate 10 carries, on both sides of the center plate 11, a spring-like extension 14 which has a respective nose catch 15 which locks into a recess 16 of the relay housing 1. During assembly, first the base plate 10 is joined with the relay 1 by means of the extensions 14. Then, the multiple metal strip sheet 8 is pushed onto the connector side 3 of the relay, whereby the connector tabs 6 are inserted into the shaped slots 13. The connector side 3 and its attached multiple strip sheet 8 is then dipped into a solder bath, and the bridges 7 are cut along the separation lines 17. Notches could also be cut at the location of the separation lines 17 such that the bridges could be broken out. The connector tabs 6 have shoulders 18 which make contact with the base plate 10. As a precaution against a side-ways movement of the connection tabs in the slots 13, an indentation 19 is provided in the base plate 10 for the shoulders 18. At the opposite side the connection tabs are each anchored to the base plate 10 by means of a twist of the side tabs 20. This form of retention is illustrated in FIGS. 6 and 7.

Figure 3:
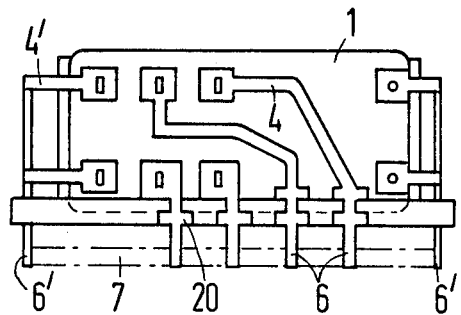
FIGS. 3, 4 and 5 are different views of the finished, converted building block.
Figure 4:
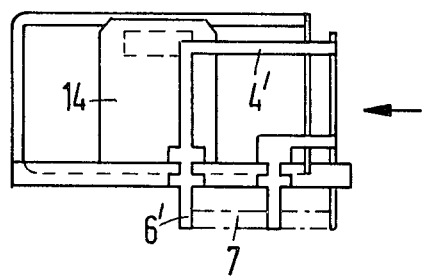
Figure 5:
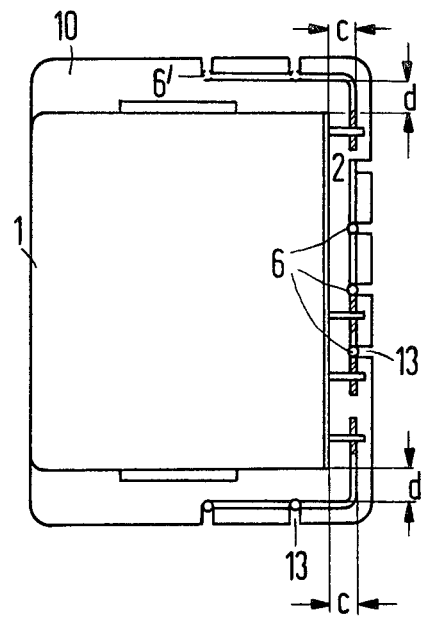

In FIGS. 3-5 the relay is illustrated as attached to an adapter in three separate views. The metal strips 4 which are attached in a single plane to the relay 1 form a U-shaped frame such that the connector tabs 6 surround the relay on three sides in a single row. Whenever this converted relay is assembled to a PC board, the connector tabs are not along one side of the relay, but surround the relay on three sides and therefore result in a stable mounting to the PC board.

Also, a larger number of relay contact pins can therefore be distributed in this manner at the three side walls of the relay, It is not required, however, that the metal strips 4 touch the side walls of the relay. The distance c and d can be selected to be greater than zero in order to increase the required creep resistance.

Figure 6:
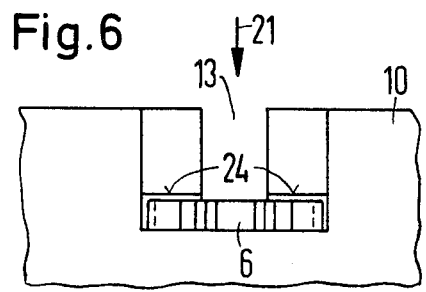
FIGS. 6 and 7 are detailed illustrations of the fixation of the adapter contact tabs.
Figure 7:
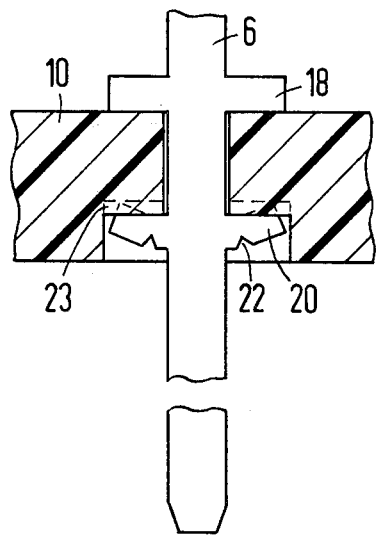
Figure 8:
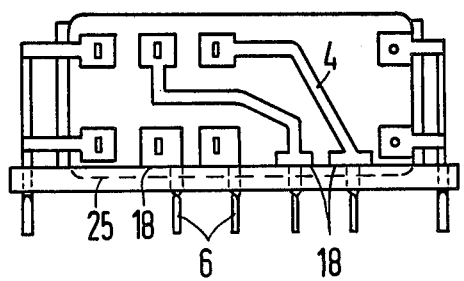
FIGS. 8 and 9 show another construction for the attachment of the contact tabs.
Figure 9:
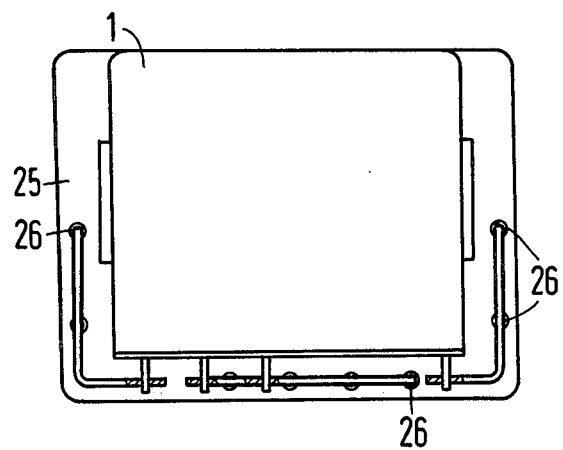

Referring to FIGS. 6 and 7, two views are illustrated for the anchoring of the conductor tabs in the base plate 10. The conductor tab 6 which was inserted into the slot 13 in the direction of the arrow 21 rests with its shoulders 18 on the base plate 10. At the opposite side of the base plate 10, the conductor tab has two wing extensions 20 which can be deformed by a notch 22 into a channel 23. The shoulders 24 of the channel 23 hold the wing extensions 20 in place sideways and secure the connector tab 6 against slipping. In this case, the indentations 9 illustrated in FIG. 1 for the corresponding shoulders 18 are not required. The connector tabs, however, can also be anchored in the manner already illustrated, by twisting. In this case, closed holes can be used instead of the side-slotted opening in the base plate. A corresponding illustrative example is shown in FIGS. 8 and 9 of this type of construction. In all other respects, the base plate, here referenced 25, can be designed as illustrated in the preceding FIGS. and only the opening 26 which carry the connector tabs are different, these openings not being slotted to open at the side. The tabs rest, as illustrated in the preceding examples, with their shoulders 18 on the base plate 25 and are fixed in position on the opposite side by a twisting of the tabs 6. Also, in this case, the wing extensions 20 can be provided on the connection tabs and can be fixed in position by means of a raster of notches which is not illustrated herein.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. An electrical building block in combination with an angular adapter, comprising:
    a housing for said building block and said housing including a first surface and second and third surfaces which are perpendicular to said first surface, a plurality of electrical contact pins extending from said first surface of said building block in a direction perpendicular to said first surface; and
    said adapter including a carrier plate having a row of holes therein, a plurality of solder eyelets extending parallel to said first surface for receiving respective ones of said contact pins therein, and metal contact strips extending from respective solder eyelets and generally parallel to said surfaces of said housing to be received in the holes of said carrier plate, including means on said strips for anchoring said strips to said carrier plate,
    some of said metal contact strips extending parallel to said first surface, others of said metal contact strips extending parallel to said second surface and further ones of said metal contact strips extending parallel to said third surface, and
    the holes in said carrier plate defining a U for receiving said some, said others and said further ones of said metal contact strips.

2. An electrical building block in combination with an angular adapter, comprising:
    a housing for said building block and said housing including a first surface and second and third surfaces which are perpendicular to said first surface, a plurality of electrical contact pins extending from said first surface of said building block in a direction perpendicular to said first surface; and
    said adapter including a carrier plate having a row of holes therein, a plurality of solder eyelets extending parallel to said first surface for receiving respective ones of said contact pins therein, and metal contact strips extending from respective solder eyelets and generally parallel to said surfaces of said housing to be received in the holes of said carrier plate, including means on said strips for entering said strips to said carrier plate,
    said metal contact strips lying in planes parallel to and spaced predetermined distances from said first, second and third surfaces.

3. An electrical building block in combination with an angular adapter and a printed circuitboard, comprising:
    a housing for said building block an said housing including a first surface and second and third surfaces which are perpendicular to said first surface, a plurality of electrical contact pins extending from said first surface of said building block in a direction perpendicular to said first surface; and
    said adapter including a carrier plate having a row of holes therein, a plurality of solder eyelets extending parallel to said first surface for receiving respective ones of said contact pins therein, and metal contact strips extending from respective solder eyelets and generally parallel to said surfaces of said housing to be received in the holes of said carrier plates, including means on said strips for entering said strips to said carrier plate,
    said printed circuitboard including holes for receiving said metal contact strips.

4. The combination of claim 3, wherein said printed circuitboard includes circuit means thereon contacting said metal contact strips.

5. An electrical building block in combination with an angular adapter, comprising:
    a housing for said building block and said housing including a first surface and second and third surfaces which are perpendicular to said first surface, a plurality of electrical contact pins extending from said first surface of said building block in a direction perpendicular to said first surface; and
    said adapter including a carrier plate having a row of holes therein, a plurality of solder eyelets extending parallel to said first surface for receiving respective ones of said contact pins therein, and metal contact strips extending from respective solder eyelets and generally parallel to said surfaces of said housing to be received in the holes of said carrier plates, including means on said strips for entering said strips to said carrier plate, said carrier plate comprising a peripheral portion associated with at least two sides of said building block and having holes therein, said peripheral portion being thicker than the remaining portion of said carrier plate.

6. An electrical building block in combination with an angular adapter and a printed circuitboard, comprising:

a housing for said building block and said housing including a first surface and second and third surfaces which are perpendicular to said first surface, a plurality of electrical contact pins extending from said first surface of said building block in a direction perpendicular to said first surface; and said adapter including a carrier plate having a row of holes therein, a plurality of solder eyelets extending parallel to said first surface for receiving respective ones of said contact pins therein, and metal contact strips extending from respective solder eyelets and generally parallel to said surfaces of said housing to be received in the holes of said carrier plates, including means on said strips for entering said strips to said carrier plate, said holes being defined by surfaces which open said holes to the peripheral edge of said carrier plate.

7. The combination of claim 6, wherein:

each of said holes is in the form of a slot, and each of said slots includes a recess shoulder, and each of said metal strips includes a shoulder member which is received in said slot and rests on said recess shoulder.

8. An electrical building block in combination with an angular adapter, comprising:

a housing for said building block and said housing including a first surface and second and third surfaces which are perpendicular to said first surface, a plurality of electrical contact pin extending from said first surface of said building block in a direction perpendicular to said first surface; and said adapter including a carrier plate having a row of holes therein, a plurality of solder eyelets extending parallel to said first surface for receiving respective ones of said contact pins therein, and metal contact strips extending from respective solder eyelets and generally parallel to said surfaces of said housing to be received in the holes of said carrier plates, including means on said strips for entering said strips to said carrier plate, each of said holes being shaped to open to the peripheral edge of said carrier plate, and each of said holes including a recessed slot on the side of said carrier plate opposite said building block, each of said metal strips including a pair of spaced-apart transverse members, one of said transverse members resting on said carrier plate and the other of said transverse members positioned in said recess and including notches therein whereby the distal ends thereof may be bent into said recessed slot.

9. An electrical building block in combination with an angular adapter, comprising:

a housing for said building block and said housing including a first surface and second and third surfaces which are perpendicular to said first surface, a plurality of electrical contact pins extending from said first surface of said building block in a direction perpendicular to said first surface; and said adapter including a carrier plate having a row of holes therein, a plurality of solder eyelets extending parallel to said first surface for receiving respective ones of said contact pins therein, and metal contact strips extending from respective solder eyelets and generally parallel to said surfaces of said housing to be received in the holes of said carrier plates, including means on said strips for entering said strips to said carrier plate, said housing including a pair of spaced recesses, and said carrier plate including a pair of upwardly extending hook elements received in respective ones of said recesses as an additional anchoring structure.

10. A process for the manufacture of an angularly adapted electrical building block, comprising the steps of:

providing an electrical building block in the form of a rectangular parallelopiped having electrical contact pins;

stamping out from a metal blank a circuit structure including a number of contact strips each having a solder eyelet at one end and each connected at its other end by at least one bridge to another of such strips with all of the other ends directed toward a common plate;

bending the stamp-out circuit structure into a U-shaped form to conform to the shape of the building block;

inserting the contact pins in respective solder eyelets;

soldering the contact pins to the respective eyelets;

removing the bridges from between the other end of the contact strips to form respective terminals;

providing a carrier plate with a plurality of holes therein; inserting the terminals in the holes; and anchoring the inserted terminal ends to the carrier plate.

11. A process for the manufacture of an angularly adapted electrical building block, comprising the steps of:

stamping out from a metal blank a planar circuit structure including a number of contact strips each having a solder eyelet at one end and each connected at its other end by at least one bridge to another of such strips with all of the other ends directed toward a common plane;

providing an electrical building block having sides and having electrical contact pins;

inserting the contact pins in respective solder eyelets with the circuit structure in the planar form;

soldering the contact pins to the respective eyelets with the circuit structure in a planar form;

removing the bridges from between the other ends of the contact strips to form respective terminals;

bending the ends of the circuit structure over the sides of the building block;

providing a carrier plate with a plurality of holes therein; inserting the terminals in the holes; and anchoring the inserted terminal ends to the carrier plate.

* * * * *